United States Patent
Ng et al.

(10) Patent No.: US 9,166,568 B2
(45) Date of Patent: Oct. 20, 2015

(54) LOW POWER HIGH RESOLUTION SENSOR INTERFACE

(75) Inventors: Simon Sheung Yan Ng, Singapore (SG); Minkyu Je, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 503 days.

(21) Appl. No.: 13/607,641

(22) Filed: Sep. 7, 2012

(65) Prior Publication Data

US 2013/0063166 A1    Mar. 14, 2013

(30) Foreign Application Priority Data

Sep. 9, 2011    (SG) .................................. 201106589-3

(51) Int. Cl.
*H03K 3/26* (2006.01)
*H03K 3/0231* (2006.01)
*G01R 31/34* (2006.01)

(52) U.S. Cl.
CPC ............ *H03K 3/0231* (2013.01); *G01R 31/343* (2013.01)

(58) Field of Classification Search
CPC .................................................... H03K 3/0231
USPC ........ 331/111, 143; 327/131, 136; 324/76.58; 340/635
See application file for complete search history.

(56) References Cited

U.S. PATENT DOCUMENTS

| | | | |
|---|---|---|---|
| 6,545,555 B1 | 4/2003 | Justice et al. | |
| 8,830,181 B1 * | 9/2014 | Clark et al. | ................... 345/173 |
| 2008/0024456 A1 * | 1/2008 | Peng et al. | ..................... 345/173 |
| 2008/0088595 A1 * | 4/2008 | Liu et al. | ........................ 345/173 |
| 2011/0267309 A1 * | 11/2011 | Hanauer et al. | ............... 345/174 |

OTHER PUBLICATIONS

Khannur, et al., A 21.6μW Inductively Powered Implantable IC for Blood Flow Measurement, 2010 IEEE Asian Solid State Circuits Conference Digest of Technical Papers, (IEEE SSCC 2010).
Chan, et al., A Tactile Sensor ASIC for a Sensorized Guidewire in Minimally Invasive Surgical Operations, 2010 IEEE Asian Solid-State Circuits Conference Digest of Technical Papers, (IEEE SSCC 2010).
Chai, et al., A 64-Channel Readout ASIC for Nanowire Biosensor Array with Electrical Calibration Scheme, Proc. IEEE 3491 (IEEE 2009).
Shih, et al., A 2.3μW Wireless Intraocular Pressure/Temperature Monitor, 2010 IEEE Asian Solid-State Circuits Conference Digest of Technical Papers, (IEEE SSCC 2010).
Geraedts, et al., A 90uW 12MHz Relaxation Oscillator with a −162dB FOM, 2008 International Solid-State Circuits Conference Digest of Technical Papers 348 (ISSCC 2008).

(Continued)

*Primary Examiner* — Arnold Kinkead
(74) *Attorney, Agent, or Firm* — K. David Crockett, Esq.; Niky Economy Syrengelas, Esq.; Crockett & Crockett, PC

(57) ABSTRACT

A sensor interface circuit is provided for resolving sensor signals from a plurality of sensors into a digital sensor signal. The sensor interface circuit includes a relaxation oscillator that receives and pre-processes the sensor signals to generate an analog sensor signal. The relaxation oscillator includes one or more dynamic circuits. The sensor interface circuit also includes a monitoring module for receiving the analog sensor signal and generating the digital sensor signal in response thereto. There is also provided a sensor system front-end and a relaxation oscillator.

18 Claims, 13 Drawing Sheets

(56) References Cited

OTHER PUBLICATIONS

Gierkink, et al., A Coupled Sawtooth Oscillator Combining Low Jitter With High Control Linearity, 37 IEEE J. Solid-State Circuits 702 (IEEE 2002).

Tokunaga, et al., An On-Chip CMOS Relaxation Oscillator with Voltage Averaging Feedback, 45 IEEE J. Solid-State Circuits 1150 (IEEE 2010).

Abidi, et al., Noise in Relaxation Oscillators, 18 IEEE J. of Solid-State Circuits 794 (IEEE 1983).

Gierkink, Control linearity and Jitter of Relaxation Oscillators, (Jun. 18, 1999) (Ph.D. dissertation, University of Twente).

Choe, A Precision Relaxation Oscillator with a Self-Clocked Offset-Cancellation Scheme for Implantable Biomedical SoCs, 2009 IEEE International Solid-State Circuits Conference Digest of Technical Papers 402 (IEEE ISSCC 2009).

Grassi, et al., A 0.1% Accuracy 100Ω-20MΩ Dynamic Range Integrated Gas Sensor Interface Circuit with 13+4 Bit Digital Output, 2005 Proc. of the 31st European Solid State Circuits Conference 351 (SSCC 2005).

Grassi, et al., A 141-dB Dynamic Range CMOS Gas-Sensor Interface Circuit Without Calibration with 16-Bit Digital Output Word, 42 IEEE Journal of Solid-State Circuits 1543 (IEEE 2007).

Lasanen, et al., A 1.2-V CMOS RC Oscillator for Capacitive and Resistive Applications, 57 IEEE Transactions on Instrumentation and Measurement 2792 (IEEE 2008).

Sebastiano, A Low-Voltage Mobility-Based Frequency Reference for Crystal-Less ULP Radios, 2009 Journal of Solid-State Circuits Conference 309 (JSSCC 2009).

Cho, et al., A 32μW, 1/83kS/s Carbon Nanotube Chemical Sensor System, 44 Journal of Solid-State Circuits Conference 659 (JSSCC 2009).

Liu, et al., A Low-Power Wide-Range Interface Circuit for Nanowire Sensor Array Based on Resistance-to-Frequency Conversion Technique, ISIC 13 (2009).

Wakayama, et al., A 30-MHz Low-Jitter High-Linearity CMOS Voltage-Controlled Oscillator, 22 IEEE Journal of Solid-State Circuit 1074 (IEEE JSSCC 1987).

Navid, et al., Minimum Achievable Phase Noise of RC Oscillators, 40 IEEE Journal of Solid-State Circuits 348 (IEEE JSSCC 2005).

* cited by examiner

LOW POWER HIGH RESOLUTION SENSOR INTERFACE

This application claims priority to Singapore Patent Application No. 201106589-3, filed Sep. 9, 2011.

FIELD OF INVENTION

The present invention relates to a sensor interface, in particular, a lower power high resolution sensor interface, and associated sensor system front-end and relaxation oscillator for various applications such as in biomedical electronics.

BACKGROUND

Resistive and capacitive sensors are widely used in biomedical applications to measure various parameters such as flow, pressure, temperature, and chemical species like glucose, protein and DNA. A conventional sensor interface typically consists of an analog front-end (AFE), a programmable gain amplifier (PGA) and an analog-to-digital converter (ADC). Such a conventional sensor interface may provide good performance in terms of sensing resolution and dynamic range, but it is not able to reduce its power and silicon area consumption to a level which is desirable in biomedical applications. A known approach to address this constraint is to convert the sensor output into a form of frequency by using an oscillator circuit. A typical choice of oscillator for this application is an RC type, which features small silicon area and low power consumption when compared with its LC type counterpart. Among RC oscillators, relaxation oscillator (ROSC) is preferred due to its constant frequency tuning gain and continuous phase readout. However, a major problem associated with ROSC is its poor phase noise and jitter performance. This reduces the resolution of the RC relaxation oscillator (RCOSC) based sensor interface. Accordingly, it is desirable to provide a low power high resolution RCOSC based sensor interface.

SUMMARY

According to a first aspect of the present invention, there is provided a sensor interface circuit for resolving sensor signals from a plurality of sensors into a digital sensor signal, the sensor interface circuit comprising:
a relaxation oscillator for receiving and pre-processing the sensor signals to generate an analog sensor signal, the relaxation oscillator comprising one or more dynamic circuits; and
a monitoring module for receiving the analog sensor signal and generating the digital sensor signal in response thereto.
Preferably, the monitoring module comprises:
a fixed frequency generation device for generating a clock signal having a fixed frequency of clock pulses; and
a variable window frequency counting device for determining a number of clock pulses within a variable counting window.
Preferably, the variable window frequency counting device varies the variable counting window between a predetermined minimum oscillator frequency and a predetermined maximum oscillator frequency, the predetermined minimum oscillator frequency and the predetermined maximum oscillator frequency determined in response to operational parameters of the relaxation oscillator.
Preferably, the fixed frequency generation device has a fixed frequency determined in response to operational parameters of the relaxation oscillator.

Preferably, the monitoring module further comprises front end circuitry coupled between the relaxation oscillator and the variable window frequency counting device for pre-processing the analog signal from the relaxation oscillator for frequency counting by the variable window frequency counting device.
Preferably, the relaxation oscillator further comprises one or more comparators having a comparator reference voltage, and wherein the one or more dynamic circuits includes a dynamic capacitor circuit coupled to the comparators, the dynamic capacitor circuit being configured to reduce its discharge capacitance in response to a determination that its capacitor voltage approximates the comparator reference voltage of the one or more comparators.
Preferably, the dynamic capacitor circuit comprises one or more MOS varactors respectively coupled to the one or more comparators.
Preferably, the relaxation oscillator further comprises one or more capacitors, and wherein the one or more dynamic circuits includes a dynamic current discharge circuit coupled to the one or more capacitors, the dynamic current discharge circuit being configured to increase a discharge current for the one or more capacitors in response to a determination that a voltage of the one or more capacitors approximates a comparator reference voltage.
Preferably, the relaxation oscillator further comprises one or more comparators having the comparator reference voltage, and wherein the one or more dynamic circuits further includes a dynamic capacitor circuit comprising the one or more capacitors and coupled to the comparators, and wherein the dynamic current discharge circuit is configured to increase the discharge current and the dynamic capacitor circuit is configured to reduce its discharge capacitance in response to a determination that its capacitor voltage approximates the comparator reference voltage.

According to a second aspect of the present invention, there is provided a sensor system front-end comprising:
a plurality of sensors; and
a sensor interface for resolving sensor signals from the plurality of sensors into a digital sensor signal, the sensor interface comprising:
    a relaxation oscillator for receiving and pre-processing the sensor signals to generate an analog sensor signal, the relaxation oscillator comprising one or more dynamic circuits; and
a monitoring module for receiving the analog sensor signal and generating the digital sensor signal in response thereto, wherein the monitoring module comprises a variable window frequency counting device.
Preferably, the plurality of sensors comprises a plurality of resistive sensors.
Alternatively, the plurality of sensors comprise a plurality of capacitive sensors.
Preferably, the monitoring module comprises:
a fixed frequency generation device for generating a clock signal having a fixed frequency of clock pulses; and
a variable window frequency counting device for determining a number of clock pulses within a variable counting window.
Preferably, the variable window frequency counting device varies the variable counting window between a predetermined minimum oscillator frequency and a predetermined maximum oscillator frequency, the predetermined minimum oscillator frequency and the predetermined maximum oscillator frequency determined in response to operational parameters of the relaxation oscillator.
Preferably, the fixed frequency generation device has a fixed frequency determined in response to operational parameters of the relaxation oscillator, and wherein the monitoring module further comprises front end circuitry coupled between the relaxation oscillator and the variable window frequency counting device for pre-processing the analog signal from the relaxation oscillator for frequency counting by the variable window frequency counting device.

Preferably, the relaxation oscillator further comprises one or more comparators having a comparator reference voltage, and wherein the one or more dynamic circuits includes a dynamic capacitor circuit coupled to the comparators, the dynamic capacitor circuit being configured to reduce its discharge capacitance in response to a determination that its capacitor voltage approximates the comparator reference voltage of the one or more comparators.

Preferably, the dynamic capacitor circuit comprises one or more MOS varactors respectively coupled to the one or more comparators.

Preferably, the relaxation oscillator further comprises one or more capacitors, and wherein the one or more dynamic circuits includes a dynamic current discharge circuit coupled to the one or more capacitors, the dynamic current discharge circuit being configured to increase a discharge current for the one or more capacitors in response to a determination that a voltage of the one or more capacitors approximates a comparator reference voltage.

Preferably, the relaxation oscillator further comprises one or more comparators having the comparator reference voltage, and wherein the one or more dynamic circuits further includes a dynamic capacitor circuit comprising the one or more capacitors and coupled to the comparators, and wherein the dynamic current discharge circuit is configured to increase the discharge current and the dynamic capacitor circuit is configured to reduce its discharge capacitance in response to a determination that its capacitor voltage approximates the comparator reference voltage.

According to a third aspect of the present invention, there is provided a relaxation oscillator comprising:

comparators, each having a comparator reference voltage input, a signal input and an output, wherein the comparator reference voltage input of each of the comparators are connected to a comparator reference voltage source;

variable capacitors, wherein the number of the variable capacitors is equal to the number of the comparators, and wherein each of the variable capacitors is connected between a ground voltage potential and the signal input of a corresponding one of the comparators and each of the variable capacitors is controlled to reduce its discharging capacitance only when its capacitor voltage approximates a voltage of the comparator reference voltage source;

discharge circuits respectively coupled to the variable capacitors, each of the discharge circuits coupled to the respective variable capacitor is coupled to the ground voltage potential and an oscillator output, the discharge circuits are configured to increase a discharge current for the variable capacitors only when a voltage of the variable capacitors approximates the voltage of the comparator reference voltage source;

an oscillator input section for receiving a sensor input from a plurality of sensors and providing the sensor input to each of the signal inputs of the comparators; and a frequency generation circuit coupled to the output of the comparators and to the oscillator input section for generating an analog signal from the sensor input for provision to an oscillator output of the frequency generation circuit by controlling provision of the sensor input to the signal inputs of the comparators.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

As described in the background, a major problem associated with a conventional relaxation oscillator (ROSC) based sensor interface is its poor phase noise and jitter performance, which reduces its resolution. Embodiments of the present invention seek to improve the resolution of the relaxation oscillator based sensor interface, preferably without causing an undesirable increase in its power consumption.

Figure 1:
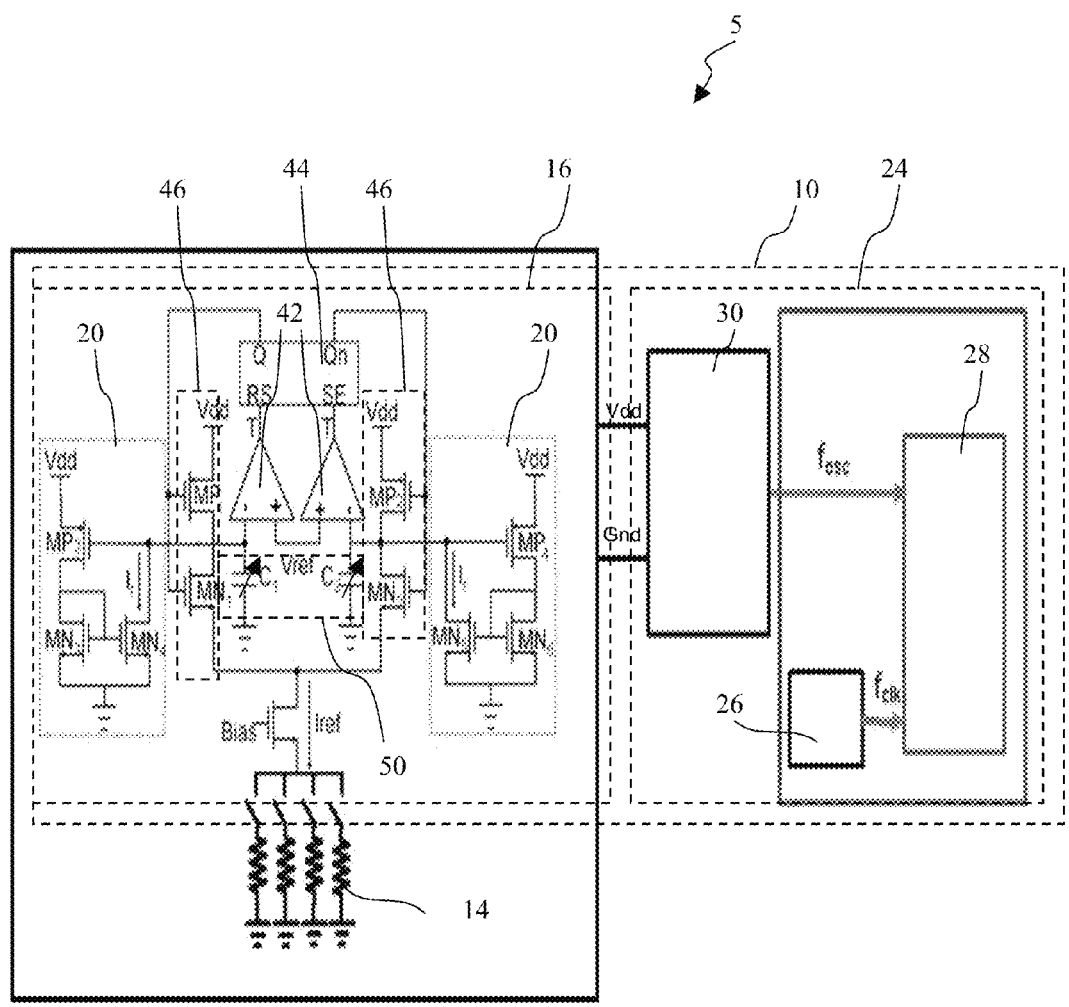
FIG. 1 depicts a block diagram of a sensor system front-end including a relaxation oscillator based sensor interface circuit according to an embodiment of the present invention.

FIG. 1 illustrates a block diagram of a sensor system front-end 5 comprising a relaxation oscillator based sensor interface circuit 10 according to an embodiment of the present invention for resolving (e.g., processing or converting) sensor signals from a plurality of sensors 14 into a digital sensor signal. The sensor interface circuit 10 comprises a relaxation oscillator 16 for converting the outputs of the sensors 14 into frequency forms. In particular, the relaxation oscillator 16 is operable for receiving and pre-processing the sensor signals to generate an analog sensor signal, and comprises one or more dynamic circuits 18, 20 for improving phase noise and jitter performance of the relaxation oscillator 16. Details of the dynamic circuits 18, 20 will be described later below according to embodiments of the present invention. The sensor interface circuit 10 further comprises a monitoring module 24 for receiving the analog sensor signal from the relaxation oscillator 16 and generating the digital sensor signal in response thereto.

The relaxation oscillator 16 comprises one or more comparators 42 respectively coupled to signal inputs of a frequency generation circuit 44. For simplicity and ease of understanding, the present invention will be described whereby the relaxation oscillator 16 comprises two comparators 42 as shown in FIG. 1 according to a preferred embodiment. However, it is apparent to a person skilled in the art that the number of comparators in the relaxation oscillator is not limited to two, and more or less comparators (and thus more or less associated components) may be provided in the relaxation oscillator for various purposes. Each of the comparators 42 has a comparator reference voltage input (e.g., at its positive terminal (+)), a signal input (e.g., at its negative terminal (−)) and an output. The comparator reference voltage input is connected to a comparator reference voltage source $V_{ref}$. The frequency generation circuit 44 comprises signal inputs respectively coupled to the outputs of the comparators 42, and signal outputs respectively coupled to corresponding oscillator input sections 46. For example, the frequency generation circuit 44 can be a RS flip-flop or various other suitable frequency generation circuits 44 known to a person skilled in the art. In the case of an RS flip-flop 44, the set and reset signal inputs SE, RS of the RS flip-flop 44 are respectively coupled to the outputs of the comparators 42. The signal outputs Qn, Q of the RS flip-flop 44 are respectively coupled to the corresponding oscillator input sections 46 as shown in FIG. 1. The relaxation oscillator 16 comprises two capacitors $C_1$, $C_2$ alternatively charged to voltage supply $V_{dd}$ and discharged by current $I_{ref}$ depending on the state of the frequency generation circuit 44. Complementary square-wave clock signals are generated at the frequency generation circuit 44 in which the oscillation frequency is determined by $I_{ref}$, $V_{ref}$, $C_1$, and $C_2$. Each oscillator input section 46 is configured to receive a sensor input from the plurality of sensors 14 and a corresponding oscillator output Q, Qn from the frequency generation circuit 44. The oscillator input section 46 is configured to provide the sensor input to the signal input of the corresponding comparator 42. For example, referring to oscillator input section 46 coupled to the capacitor $C_2$, the oscillator input section 46 includes a PMOS transistor $MP_2$ connected in series with an NMOS transistor $MN_2$. The PMOS transistor $MP_2$ has a source coupled to the voltage supply $V_{dd}$, a gate coupled to the oscillator output $Q_n$ and the gate of the NMOS transistor $MN_2$, and a drain coupled to the signal input of the corresponding comparator 42 and the drain of the NMOS transistor $MN_2$. The NMOS transistor $MN_2$ has a source coupled to the plurality of sensors 14 for receiving the sensor input, a gate coupled to the oscillator output $Q_n$ and the gate of PMOS transistor $MP_2$, and a drain coupled to the signal input of the corresponding comparator 42 and the drain of the PMOS transistor $MP_2$. The oscillator input section 46 coupled to the capacitor $C_1$ comprises the same components and is configured in the same manner, with the mere exception that it is instead coupled to the oscillator output $Q_n$ and the signal input of the other comparator 42. With this configuration, the frequency generation circuit 44 is operable to generate an analog signal from the sensor input for provision to the oscillator output by controlling the provision of the sensor input to the signal inputs of the comparators 42. Details of the dynamic circuits 18, 20 for improving phase noise and jitter performance of the relaxation oscillator 16 will be described later below according to embodiments of the present invention.

An exemplary technique for improving the resolution of the sensor interface circuit 10 according to a first embodiment of the present invention will now be described. In this embodiment, the present inventors have identified that a major factor which limits the resolution of an oscillator based sensor interface circuit is its output frequency counting scheme. The output frequency from the sensor interface circuit is obtained by counting the number of positive-edges within a fixed period of time. The overall system resolution is limited by both the minimum Least Significant Bit (LSB) steps of the positive-edges number and its dynamic range. The present inventors have identified that since the number of positive-edges is indirectly proportional to the output oscillation period, the minimum LSB step of the positive-triggered edges number becomes the dominant factor for limiting the system resolution.

In this embodiment, to improve the resolution of the sensor interface circuit 10, the monitoring module 24 comprises a fixed frequency generation device 26 for generating a clock signal having a fixed frequency of clock pulses, and a variable window frequency counting device 28 for determining a number of clock pulses within a variable counting window. In the sensor interface circuit 10, the output frequency is directly related to the sensor information. Furthermore, the variable window frequency counting device 28 varies the variable counting window between a predetermined minimum oscillator frequency and a predetermined maximum oscillator frequency, the predetermined minimum oscillator frequency and the predetermined maximum oscillator frequency determined in response to operational parameters of the relaxation oscillator 16. The fixed frequency generation device 26 has a fixed frequency determined in response to operational parameters of the relaxation oscillator 16. For better understanding, a specific example will now be described with reference to FIG. 2B in comparison to a conventional output frequency counting scheme shown in FIG. 2A.

Figure 2A:
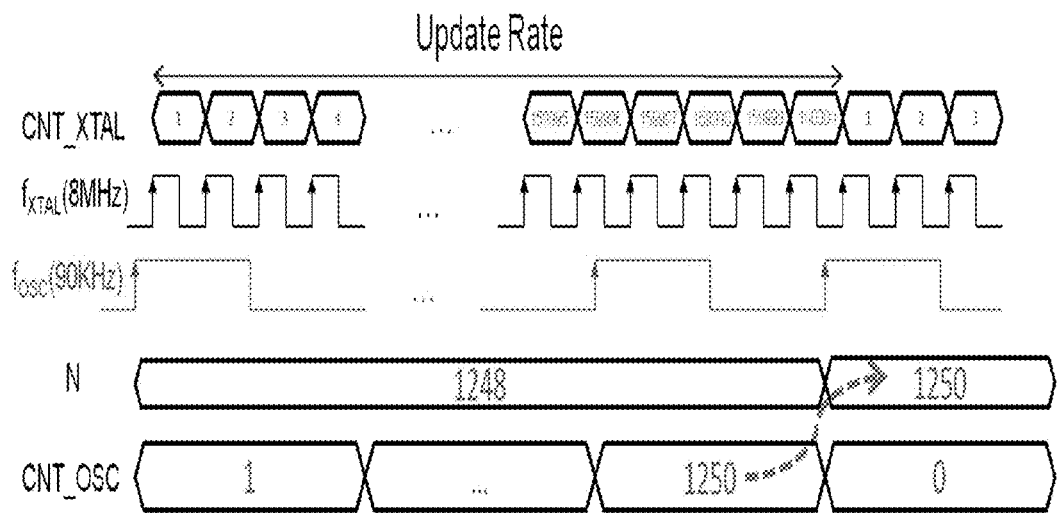
FIGS. 2A and 2B illustrate a conventional output frequency counting scheme and an output frequency counting scheme according to a first embodiment of the present invention, respectively.

FIG. 2A illustrates an exemplary conventional output frequency counting scheme whereby the output frequency from the sensor interface circuit is obtained by counting the number of positive-edges within a fixed period of timing window (or counting window period). The fixed counting window period is usually generated using an external crystal with a higher oscillation frequency. The number of oscillator edges during a fixed counting window period is given by:

$$N = \frac{T_{CNT}}{T_{OSC}} \quad (1)$$

The number of oscillator edges (N) is indirectly proportional to the output oscillation period ($T_{osc}$). In order to achieve M-bit resolution in the sensor interface, the output frequency counting scheme must satisfy the following requirements:

1) The dynamic range of the counting scheme must be larger than $2^M$ steps:

$$N_{MAX} - N_{MIN} \geq 2^M \quad (2)$$

where $N_{MAX}$ and $N_{MIN}$ correspond to the number of oscillator edges at the shortest and longest output period respectively.

2) The minimum LSB of step $N_{MIN}$ must be larger than 1.

$$T_{CNT}\left(\frac{1}{\left(T_{OSC,MAX} - \frac{T_{OSC,MAX} - T_{OSC,MIN}}{2^M}\right)} - \frac{1}{T_{OSC,MAX}}\right) \quad (3)$$

The second requirement is usually the dominant factor in the conventional frequency counting scheme. In this example, the counting window period is fixed at 20 ms. The sensor interface output period varies from µs to 15.38 µs and the corresponding maximum and minimum number of edges, $N_{MAX}$ and $N_{MIN}$, is 1800 and 1300 respectively. From Equation (3), it is determined that the exemplary conventional sensor interface can only achieve 8.5 bits in resolution.

Figure 2B:
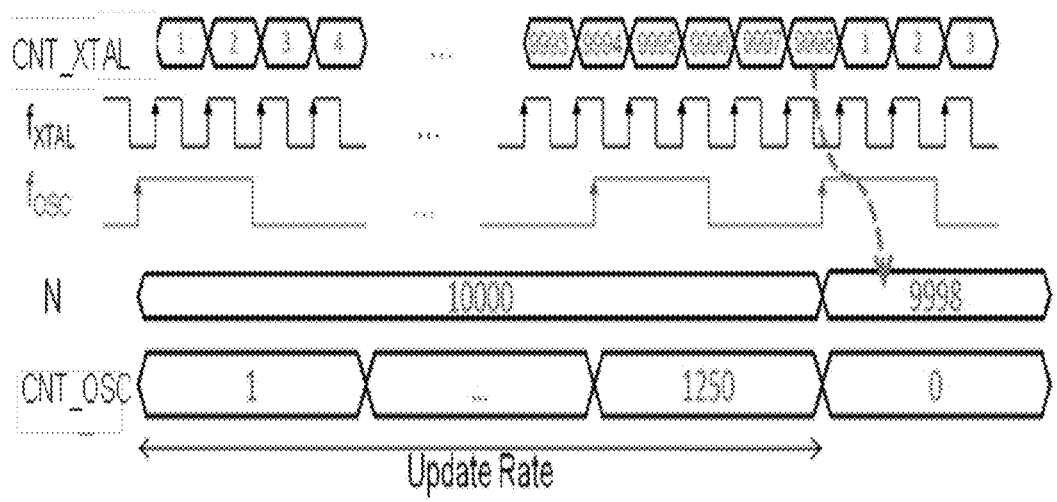

To improve the resolution of the sensor interface circuit according to the embodiment, an output frequency counting scheme is developed whereby a fixed period of timing window is generated using the sensor interface circuit while an external crystal oscillator with higher frequency operates within the fixed period of timing window. The output frequency from the sensor interface circuit is obtained by counting number of positive-edges from the crystal oscillator within the fixed period of timing window as shown in FIG. 2B. The number of positive-edges from the crystal oscillator is directly proportional to the sensor interface output oscillation period and is given by:

$$N = \frac{T_{OSC}}{T_{CLK}} \quad (4)$$

where $T_{CLK}$ is the period of the external crystal oscillator. The length of the counting window becomes variable and depends on the maximum oscillator output period:

$$T_{CNT} \leq T_{OSC,MAX} \times \text{Sample} \quad (5)$$

where Sample is the fixed number of clock edges from the exemplary sensor interface circuit 10 to generate the counting window.

Figure 3A:
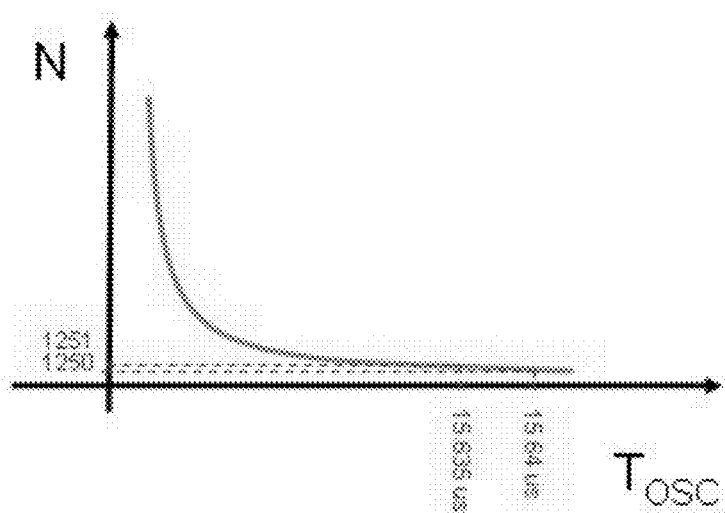
FIGS. 3A and 3B illustrate the relationship between the number of oscillator edges and the output oscillation period for the conventional output frequency counting scheme and the output frequency counting scheme according to the first embodiment, respectively.
Figure 3B:
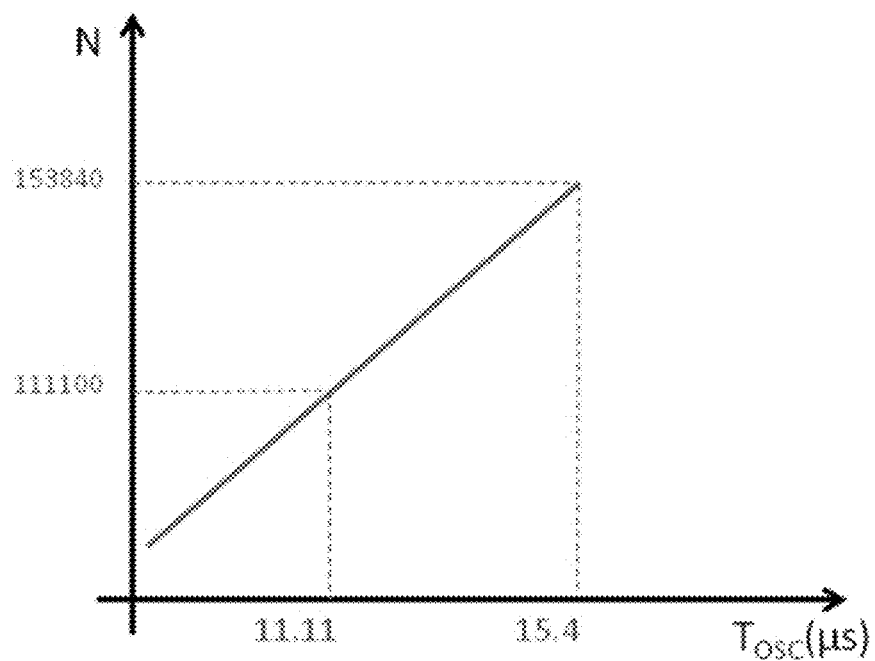

In order to achieve M-bit resolution in the exemplary sensor interface 10 according to the embodiment, the output frequency counting scheme must satisfy the dynamic range requirement only (i.e., Equation (2)). This is because the minimum LSB of step $N_{MIN}$ is always 1 since the relationship between the number of oscillator edges (N) and the output oscillation period ($T_{osc}$) is now linear as shown in FIG. 3B (in the conventional example, this relationship is not linear as shown in FIG. 3A). In the example of FIG. 2B, the maximum counting window period must be less than 20 ms. The minimum and maximum output period of the sensor interface is 11.11 µs and 15.38 µs respectively. From Equation (3), the fixed number of clock edges from the sensor interface to generate the counting window is 1250. Thus, the longest length of the counting window is 19.23 ms. By counting number of edges from, for example, an 8 MHz external crystal oscillator 26 within these counting windows, the minimum and maximum number of edges, $N_{MIN}$ and $N_{MAX}$, are 111,100 and 153,840 respectively. A person skilled in the art will appreciate that the fixed frequency generation device 26 is not limited to an 8 MHz oscillator 26 and other frequencies can be used as appropriate. As a result, the exemplary sensor interface 10, by employing a modified novel counting scheme according to the embodiment, can be shown to achieve 15.5 bits in resolution in the example. This represents a significant improvement when compared with the conventional example described hereinbefore. It will be appreciated to a person skilled in the art that the values used/determined in the example are for illustration purpose only and the present invention is not limited to such values as they are used/determined based on operational parameters of the relaxation oscillator 16.

As shown in FIG. 1, the monitoring module 24 further comprises a front end circuitry 30 coupled between the relaxation oscillator 16 and the variable window frequency counting device 28 for pre-processing the analog signal from the relaxation oscillator 16 for frequency counting by the variable window frequency counting device 24.

An exemplary technique for improving the resolution of the relaxation oscillator based sensor interface circuit 10 according to a second embodiment of the present invention will now be described. In this embodiment, the present inventors have identified that one of the major factors which limits the resolution of a conventional relaxation oscillator based sensor interface circuit is the phase noise and jitter performance of the relaxation oscillator. The present inventors have identified that the main contributors to the jitter in the conventional relaxation oscillator are the noise from the comparator and $V_{ref}$ generator (which can be represented as a voltage noise source $v_n$ in series with $V_{ref}$), and the noise from the $I_{ref}$ circuit (which can be represented as a current noise source $i_n$ in parallel with $V_C$). The variance of the oscillation period error due to $v_n$ can thus be calculated as:

$$(\sigma_{\Delta T_{OSC}, v_n})^2 = \frac{2 S_{v_n}}{(dV_C/dt)^2} \cdot BW_{n,comp} \quad (6)$$

where $S_{v_n}$ is the power spectral density of the white noise voltage $V_n$ and $BW_{n,comp}$ is the noise bandwidth of the comparator which has a direct relation with the comparator delay.

The discharging rate of the capacitor voltage $V_C$ can be expressed as:

$$\frac{dV_C}{dt} = \frac{I_{ref}}{C} \quad (7)$$

Therefore, Equation (6) can be expressed as:

$$(\sigma_{\Delta T_{OSC}, v_n})^2 = 2 S_{v_n} \frac{C^2}{I_{ref}^2} \cdot BW_{n,comp} \quad (8)$$

The noise current $i_n$ affects the moment when the $V_C$ crosses the $V_{ref}$ as it is integrated by the capacitor during the discharging phase. The variance of the resulted oscillation period error is calculated as:

$$(\sigma_{\Delta T_{OSC}}, i_n)^2 = \frac{(S_{i_n}/2) \cdot (T_{OSC}/C^2)}{(dV_C/dt)^2} = \frac{S_{i_n}}{2} \cdot \frac{T_{OSC}}{I_{ref}^2} \quad (9)$$

in which $S_{i_n}$ is the power spectral density of the white noise current $i_n$, and the oscillation period $T_{OSC}$ is given by $$T_{OSC} = \frac{2C(V_{DD} - V_{ref})}{I_{ref}} \quad (10)$$

From (8) and (9), the periodic RMS jitter $\sigma_{\Delta T_{osc}}$ can thus be expressed as:

$$\sigma_{\Delta T_{OSC}} = \sqrt{(\sigma_{\Delta T_{OSC}, v_n})^2 + (\sigma_{\Delta T_{OSC}, i_n})^2} \quad (11)$$

$$= \frac{1}{(dV_C/dt)} \cdot \sqrt{2S_{v_n} \cdot BW_{n,comp} + (S_{i_n}/2) \cdot (T_{OSC}/C^2)}$$

$$= \frac{1}{I_{ref}} \cdot \sqrt{2C_{v_n}C^2 \cdot BW_{n,comp} + (S_{i_n}/2) \cdot T_{OSC}}$$

From the jitter analysis result given by Equation (11), the present inventors discovered that the jitter $\sigma_{\Delta T_{osc}}$ can be improved by increasing the discharging rate of the capacitor(s) $C_1$, $C_2$ (i.e., $dV_C/dt$). However, since the oscillation period $T_{OSC}$ also decreases proportionally, it cannot reduce the normalized jitter $\sigma_{\Delta T_{osc}}/T_{OSC}$. Therefore, according to the second embodiment, to improve the normalized jitter in the relaxation oscillator, a dynamic discharging jitter improvement technique is developed to increase $dV_C/dt$ only when the discharge capacitor voltage $V_C$ approximates (i.e., is in the vicinity of) the comparator trip voltage ($V_{ref}$). As a result, the $T_{OSC}$ remains unchanged and the normalized jitter performance can therefore improved. For better understanding, two specific examples for increasing the discharging rate ($dV_C/dt$) of the capacitor(s) $C_1$, $C_2$ only when $V_C$ is in the vicinity of the comparator trip voltage will now be described below. Specifically, a dynamic current discharge circuit 20 is provided which is configured to increase the discharging current, and/or a dynamic capacitor circuit 18 is provided which is configured to reduce its discharging capacitance, when the $V_C$ is in the vicinity of the comparator reference. However, it will be apparent to a person skilled in the art the present invention is not limited to the specific examples described herein and other implementations are within the scope of the present invention as long as they function in the same or similar manner, i.e., increase the discharging rate ($dV_C/dt$) of the capacitor(s) $C_1$, $C_2$, when $V_C$ approximates (i.e., in the vicinity of) the comparator trip voltage $V_{ref}$.

Dynamic Current Discharge Implementation

Figure 4:
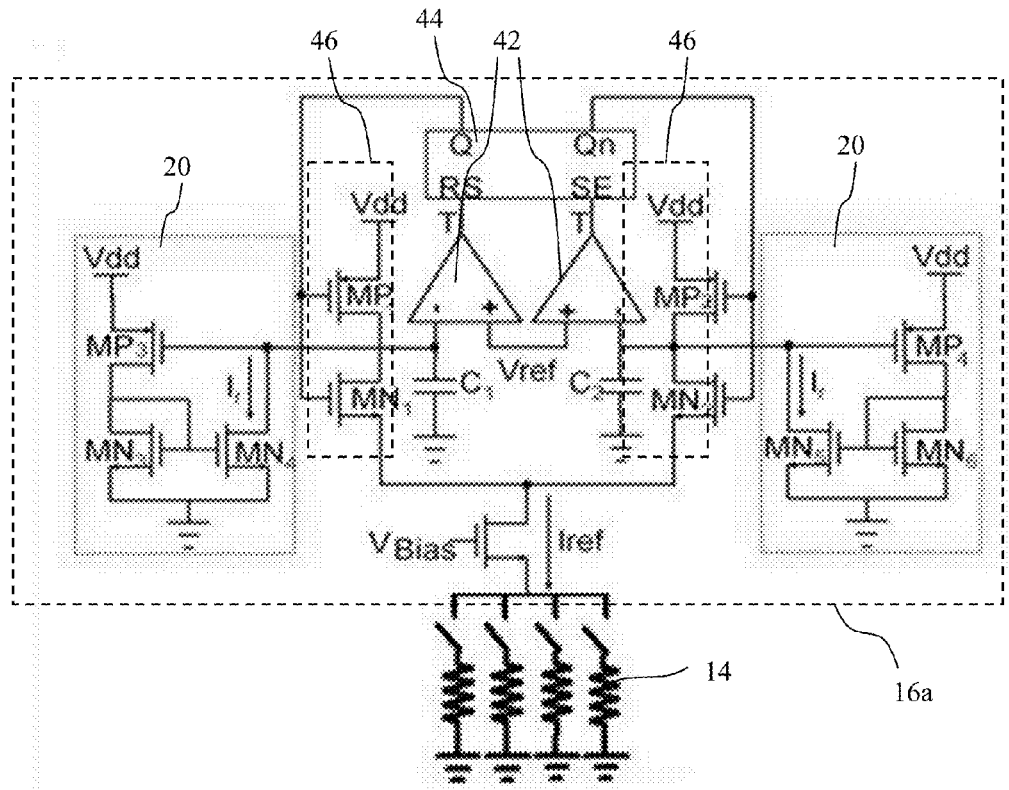
FIG. 4 depicts a block diagram of an exemplary relaxation oscillator including a dynamic current discharge circuit according to a second embodiment of the present invention.

FIG. 4 illustrates an exemplary relaxation oscillator 16a with a dynamic current discharge circuit 20. The relaxation oscillator 16a comprises one or more comparators 42 each having an input (e.g., the positive terminal (+)) coupled to a comparator reference voltage $V_{ref}$ and one or more capacitors $C_1$, $C_2$. The components of the relaxation oscillator 16a the same as the components of the relaxation oscillator 16 described hereinbefore are denoted by the same reference numbers and have the same construction and same function unless otherwise specified. The relaxation oscillator 16a comprises one or more dynamic current discharge circuit 20 respectively coupled to the one or more capacitors $C_1$, $C_2$. The dynamic current discharge circuit 20 is configured to increase a discharge current for the one or more capacitors $C_1$, $C_2$ in response to a determination that a voltage of the one or more capacitors approximates (i.e., is in the vicinity of) the comparator reference voltage $V_{ref}$.

As shown in FIG. 4, the relaxation oscillator 16a may comprise two dynamic current discharge circuits 20 respectively coupled to the two capacitors $C_1$, $C_2$. The dynamic current discharge circuit 20 coupled to the capacitor $C_1$ comprises the same components and functionality as the dynamic current discharge circuit 20 coupled to the capacitor $C_2$. Therefore, for conciseness, only the dynamic current discharge circuit 20 coupled to the capacitor $C_2$ will described in further details below. The dynamic current discharge circuit 20 comprises a PMOS transistor $MP_4$, a first NMOS transistor $MN_5$, and a second NMOS transistor $MN_6$ as shown in FIG. 4. The PMOS transistor $MP_4$ has a gate which is coupled to the capacitor $C_2$ (i.e., $V_{C2}$) and the drain of the first NMOS transistor $MN_5$, a source which is coupled to the voltage supply $V_{dd}$, and a drain which is coupled to the drain of the second NMOS transistor $MN_6$ and the gates of the first and second NMOS transistors $MN_5$, $MN_6$. The first NMOS transistor $MN_5$ has a drain which is coupled to the capacitor $C_2$ (i.e., $V_{C2}$) and the gate of the PMOS transistor $MP_4$, a gate which is coupled to the gate of the second NMOS transistor $MN_6$ and the drains of the PMOS transistor $MP_4$ and the second NMOS transistor $MN_6$, and a source which is coupled to the ground. The second NMOS transistor $MN_6$ has a drain which is coupled to its gate and the source of the PMOS transistor $MP_4$, a gate which is coupled to its drain and the gate of the first NMOS transistor $MN_5$, and a source with is coupled to the ground.

The PMOS transistors $MP_3$ and $MP_4$ are employed to monitor the voltages across the capacitors $C_1$ and $C_2$ respectively. For better understanding, the operations of the dynamic current discharge circuit 20 coupled to the capacitor $C_2$ will now be described. Assuming that $V_{OUTP}$ (i.e., output of Q) is low and $V_{OUTN}$ (i.e., output of Qn) is high, capacitor $C_2$ starts to be discharged by the main discharging current $I_{ref}$ and $V_{C2}$ is monitored by PMOS transistor $MP_4$. When $V_{C2}$ is larger than $V_{DD}-V_{thp4}$ (threshold voltage of PMOS transistor MP4), the current flowing through PMOS transistor $MP_4$ can be neglected. However, as $V_{C2}$ approaches $V_{DD}-V_{thp4}$, the extra discharging current $I_r$ starts to be generated and added to $I_{ref}$. When $V_{gsp4}$ (gate-source threshold voltage of MP4) is larger than $V_{thp4}$, this dynamic extra current can be expressed as:

$$I_r = K_{p4}(V_{gsp4} - V_{thp4})^2 \quad (12)$$

where $K_{p4} = 0.5\mu_p C_{ox}(W_{p4}/L_{p4})$. Once $MP_4$ is turned on, $MP_4$, $MN_5$ and $MN_6$ form a positive feedback loop and the discharging rate of $V_{C2}$ increases rapidly while the overall oscillation frequency remains almost unchanged. Consequently, the normalized jitter improves.

Figure 5:
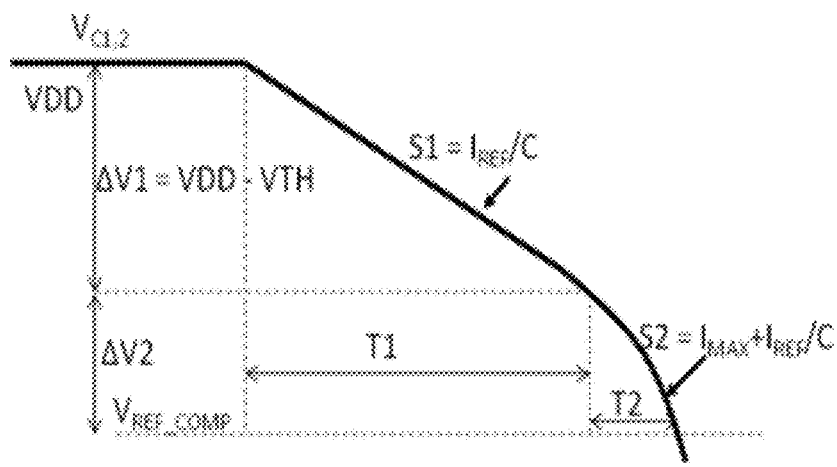
FIG. 5 illustrates an exemplary dynamic discharging waveform of the relaxation oscillator of FIG. 4.

FIG. 5 shows the approximated dynamic discharging waveform of the relaxation oscillator 16a with the dynamic current discharge circuit 20 for the jitter analysis. It can be observed that the discharging current increases dramatically in a quadratic manner at the end of the discharging period, i.e., when $V_C$ approaches the vicinity of $V_{ref}$. It will be assumed that the noise current $i_m$ from the dynamic discharging current source is negligible during $T_1$ and equal to $i_{m,avg}$ during $T_2$. The slope $S_2$ represents the discharging rate when $V_C$ is in the vicinity of the comparator trip point. The $i_{m,avg}$ is integrated by the capacitor over the period of $T_2$ and results in the variance of the capacitor voltage error given by $$\sigma_{\Delta V_C} = \frac{1}{C} \int_0^{T_2} i_{m,avg} dt. \quad (13)$$

It can be shown that (13) gives $$\sigma_{\Delta V_C} = \frac{1}{C} \sqrt{\frac{S_{i_m} T_2}{2}} \quad (14)$$

where $S_{i_m}$ the noise power spectral density of $i_m$ when $V_C$ is equal to the $V_{ref}$. The jitter due to the dynamic discharging current circuit is given by:

$$\sigma_{\Delta T_{OSC}, i_n} = \frac{\sigma_{\Delta V_C}}{(dV_C/dt)} = \frac{1}{S_2 C} \sqrt{\frac{S_{i_m} T_2}{2}} \quad (15)$$

The normalized jitter caused by the dynamic discharging current circuit is expressed as:

$$\frac{\sigma_{\Delta T_{OSC}, i_n}}{T_{OSC}} = \frac{1}{(T_1 + T_2)S_2 C} \sqrt{\frac{S_{i_m} T_2}{2}} \quad (16)$$

Similarly, the normalized jitter due to the $i_0$ integrated over $T_1$ can be written as $$\frac{\sigma_{\Delta T_{OSC}, i_n}}{T_{OSC}} = \frac{1}{(T_1 + T_2)S_2 C} \sqrt{\frac{S_{i_{refn}} T_1}{2}} \quad (17)$$

where $S_{i_{refn}}$ is the power spectral density of the white current noise $i_{refn}$ from the current source $i_{ref}$.

From Equations (1) and (5), the normalized jitter due to $v_n$ is derived as $$\frac{\sigma_{\Delta T_{OSC}, v_n}}{T_{OSC}} = \sqrt{\frac{2 S_{v_n} \cdot BW_{n,comp}}{2(V_{DD} - V_{ref})^2}} \cdot \frac{S_1}{S_2} \quad (18)$$

where $S_2 \gg S_1$. By combining (16), (17) and (18), the total jitter of the relaxation oscillator 16a with the dynamic capacitor discharging circuit 20 is:

$$\frac{\sigma_{\Delta T_{OSC}}}{T_{OSC}} = \left[ \left( \frac{1}{T_{OSC} C} \right)^2 \cdot 2 \left( S_{i_m} T_2 + S_{i_{refn}} T_1 \right) \cdot \left( \frac{1}{S_2} \right)^2 + \frac{S_{v_n} \cdot BW_{n,comp}}{2(V_{DD} - V_{ref})^2} \cdot \left( \frac{S_1}{S_2} \right)^2 \right]^{\frac{1}{2}} \quad (19)$$

Figure 6:
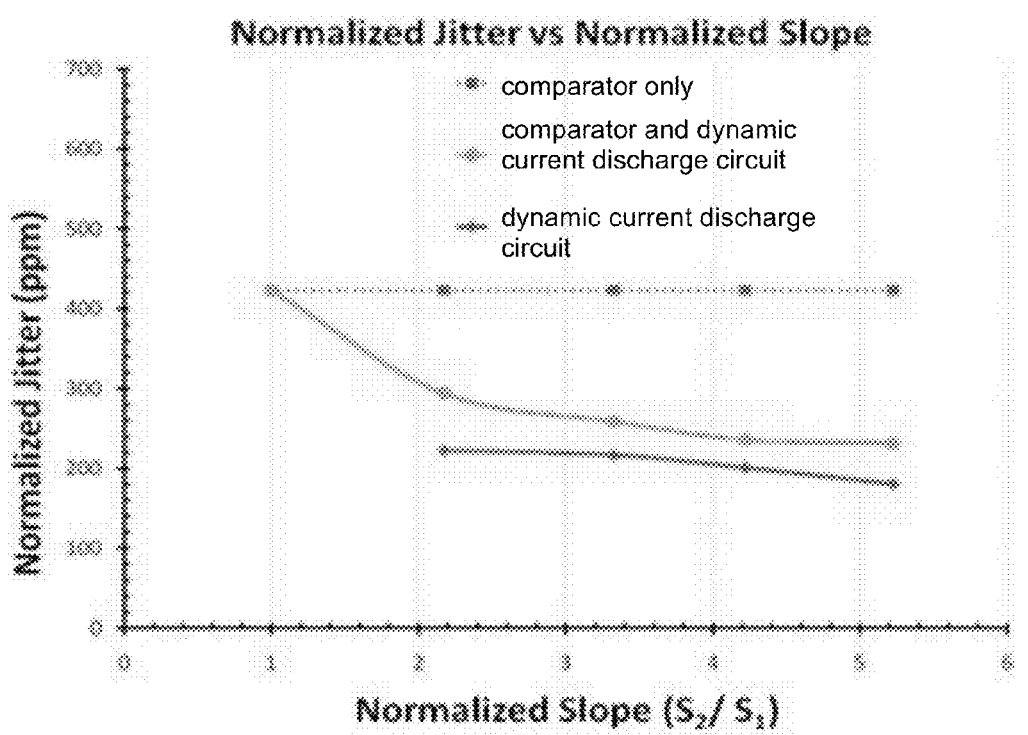
FIG. 6 illustrates exemplary simulation results of the normalized jitter of the comparator and the dynamic current discharge circuit.

FIG. 6 presents the simulation results of the normalized jitter of the comparator and the relaxation oscillator 16a with a dynamic current discharge circuit. The dynamic current discharge circuit 20 generates a normalized jitter of about 200 ppm across different $S_2/S_1$ ratios. The jitter from the comparator input-referred noise is lowered significantly as the ratio of $S_2/S_1$ is increased. However, when $S_2/S_1$ is larger than 2.5, the jitter improvement saturates because the overall jitter is now dominated by the noise from the dynamic current discharge circuit 20. Therefore, $S_2/S_1$ ratio of 2.5 is selected in a preferred embodiment of the present invention and the normalized jitter due to the comparator input-referred noise is reduced by 2.5 times.

Dynamic Capacitor Implementation

Figure 7:
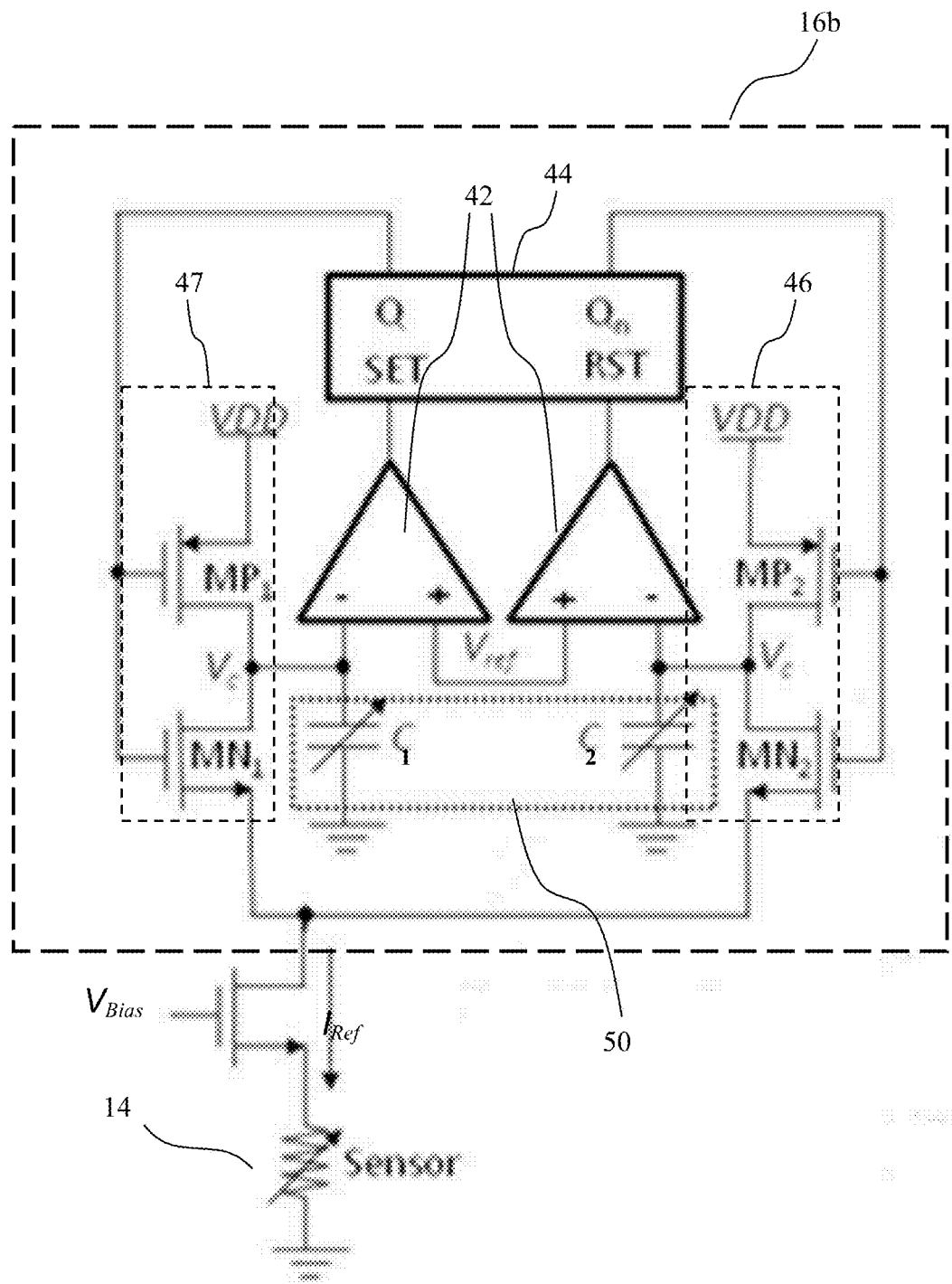
FIG. 7 depicts a block diagram of an exemplary relaxation oscillator including a dynamic capacitor circuit according to the second embodiment of the present invention.

FIG. 7 illustrates an exemplary relaxation oscillator 16b with a dynamic capacitor circuit 50 for reducing the discharging capacitance when the $V_c$ approximates (i.e., is in the vicinity of) the comparator reference $V_{ref}$. The components of the relaxation oscillator 16b the same as the components of the relaxation oscillator 16 described hereinbefore are denoted by the same reference numbers and have the same construction and same function unless otherwise specified. The relaxation oscillator 16b comprises one or more comparators 42 each having an input (e.g., the positive terminal (+)) coupled to a comparator reference voltage $V_{ref}$. The relaxation oscillator 16b further comprises a dynamic capacitor circuit 50 coupled to the comparators 42, in particular, the signal inputs (e.g., the negative terminals (−)) of the comparators 42. The dynamic capacitor circuit 50 is configured to reduce its discharge capacitance in response to a determination that its capacitor voltage approximates the comparator reference voltage $V_{ref}$ of the one or more comparators 42.

Figure 8:
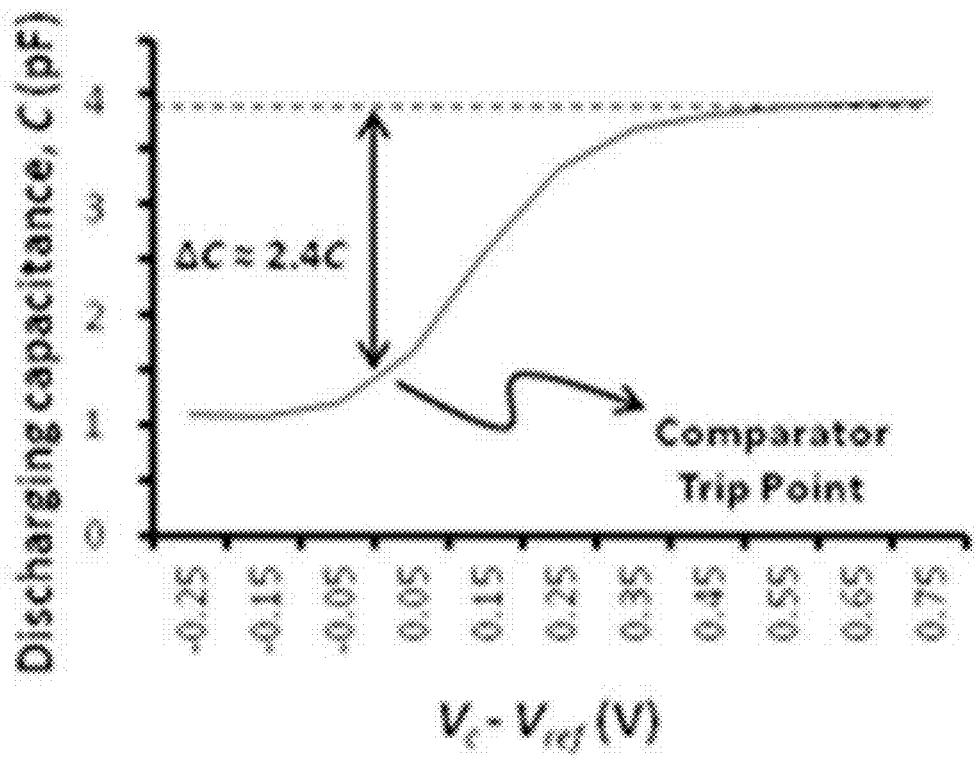
FIG. 8 illustrates the discharging capacitance of the dynamic current discharge circuit.

In a preferred embodiment, the dynamic capacitor circuit 50 comprises one or more variable capacitors (e.g., MOS varactors) $C_1$, $C_2$ respectively coupled to the signal input of the one or more comparators 42. For example, this can be achieved by replacing the conventional discharging capacitors $C_1$, $C_2$ with NMOS varactors $C_1$, $C_2$ with the same capacitance. As shown in FIG. 8, each of the MOS varactors $C_1$, $C_2$ is coupled between a corresponding signal input of the comparator 42 and the ground.

As an example shown in FIG. 8, during the start of an operation, the discharging capacitance is 3.6 pF. The discharging capacitance is reduced significantly as the operation continues. It can be seen that when $V_c$ approaches $V_{ref}$, the discharging capacitance is 1.5 pF, which is around 2.4 times lower than the capacitance when the operation started. This capacitance reduction increases the discharging slope by 2.4 times. As a result, the normalized jitter due to $v_n$ is the same as (18) which is derived from dynamic current discharge circuit 20. By combining (9) and (18), the total jitter of the relaxation oscillator 16b with the dynamic capacitor circuit 50 can be expressed as:

$$\frac{\sigma_{\Delta T_{OSC}}}{T_{OSC}} = \left[ \left( \frac{S_{in}}{2} \times \frac{T_{OSC}}{I_{ref}^2} \right) + \left( \frac{S_{v_n} \times BW_{n,comp}}{2(V_{DD} - V_{ref})^2} \times \left( \frac{S_1}{S_2} \right)^2 \right) \right]^{\frac{1}{2}} \quad (20)$$

Figure 9:
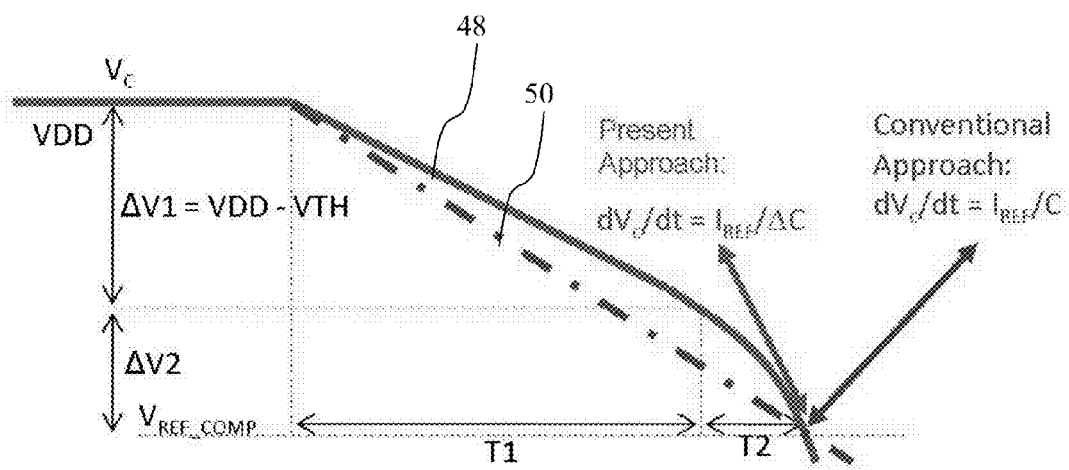
FIG. 9 illustrates an exemplary dynamic discharging waveform of the relaxation oscillator of FIG. 7.

FIG. 9 illustrates the approximated dynamic discharging waveform 48 of the relaxation oscillator 16b with the dynamic capacitor circuit 50 for jitter analysis. Similar to the approximated dynamic discharging waveform of the relaxation oscillator 16a shown in FIG. 5, it can be observed that the rate of capacitance discharge increases dramatically in a quadratic manner at the end of the discharging period, i.e., when $V_c$ approaches the vicinity of $V_{ref}$. In contrast, the rate of capacitance discharge of the conventional relaxation oscillator is linear as illustrated in the conventional waveform 49 in FIG. 9.

Accordingly, three implementations or techniques (i.e., the modified output frequency counting scheme, the dynamic current discharge technique and the dynamic capacitor technique) have been described hereinbefore for improving the resolution of the relaxation oscillator based sensor interface according to embodiments of the present invention. In a preferred embodiment, the three techniques are implemented in the sensor interface circuit 10 in conjunction as shown in FIG. 1. However, it is apparent to a person skilled in the art that not all of the techniques disclosed herein need to be implemented in a sensor interface circuit in conjunction, and fewer techniques may be implemented without deviating from the scope of the present invention.

Figure 10:
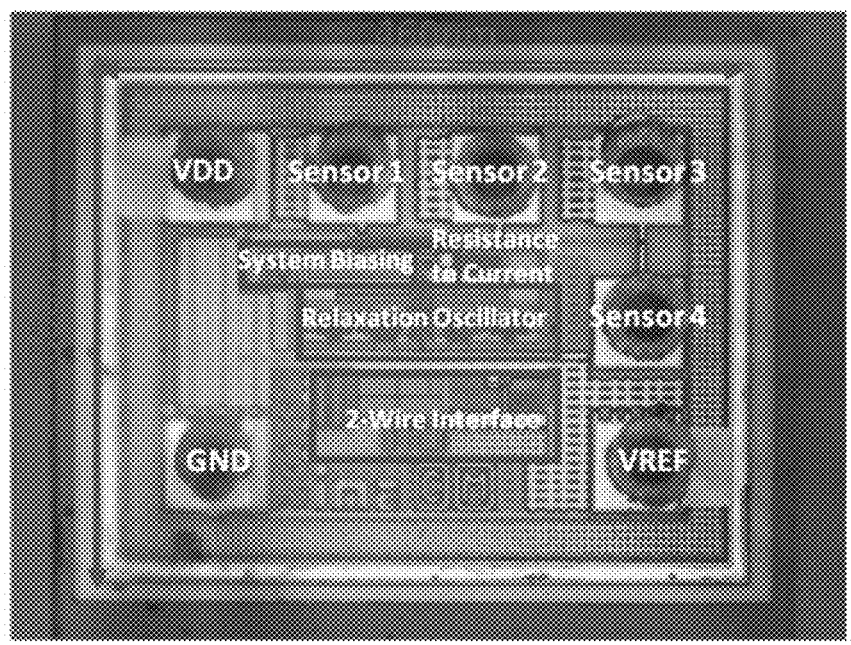
FIG. 10 illustrates a chip micrograph of an exemplary sensor interface circuit according to an embodiment of the present invention.
Figure 11A:
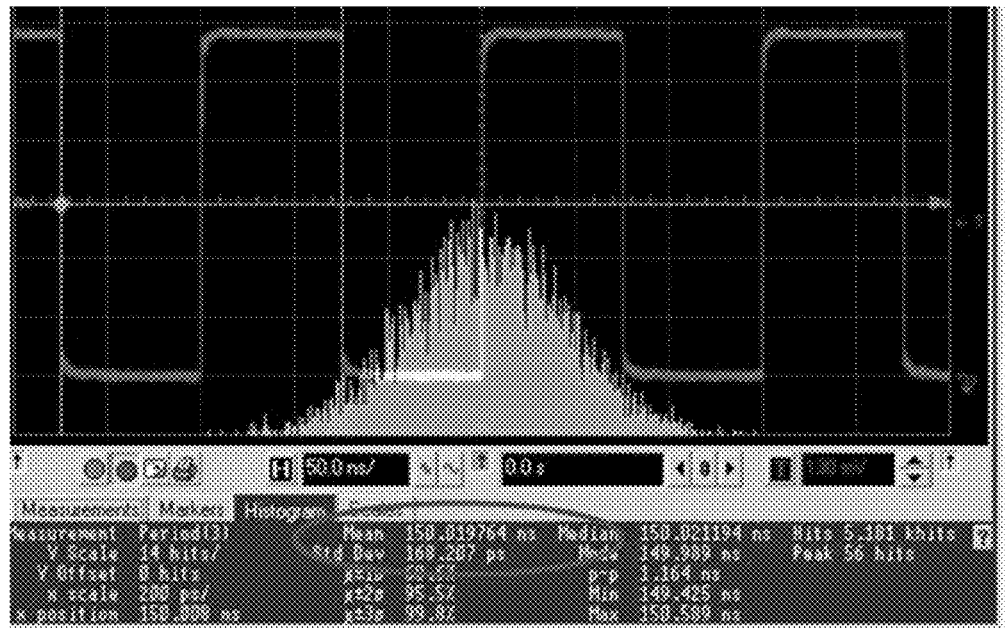
FIGS. 11A and 11B illustrate the measured jitter performances of the relaxation oscillator of FIG. 4 and the conventional relaxation oscillator, respectively.
Figure 11B:
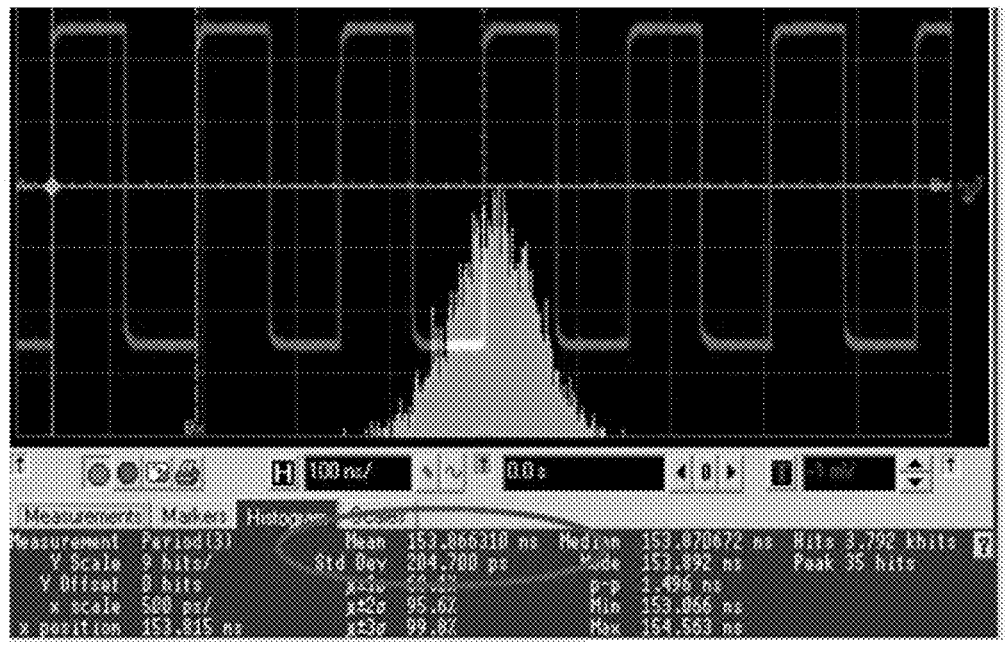
Figure 12:
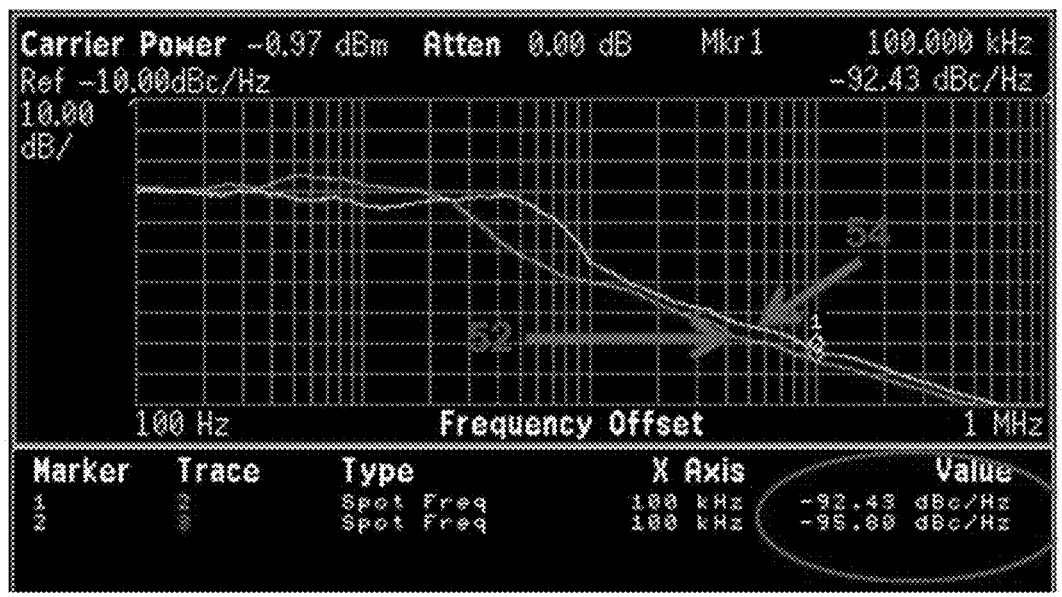
FIG. 12 shows a comparison between the phase noise measurement results of the relaxation oscillator of FIG. 4 and the conventional relaxation oscillator.

In an exemplary embodiment, a relaxation oscillator based sensor interface circuit 10 was fabricated in 0.18-μm CMOS process and the chip micrograph is shown in FIG. 10. The core die area is 0.03 mm² excluding pads. The measured jitter performance of both the relaxation oscillator 16a with the dynamic current discharge circuit 20 and the conventional relaxation oscillator are presented in FIGS. 11A and 11B respectively. When both oscillators operate at 6.7 MHz, the measured periodic RMS jitter of the relaxation oscillator 16*a* is 168 ps, which is 20% better than 205-ps jitter of the conventional relaxation oscillator. FIG. 12 illustrates the phase noise measurement result 52 from the relaxation oscillator 16*a* and the phase noise measurement result 54 from the conventional relaxation oscillator. The measured phase noise of the relaxation oscillator 16*a* and conventional relaxation oscillator is −95.8 and −92.43 dBc/Hz respectively at 10-kHz offset when the oscillation frequency is 6.7 MHz. This result agrees with the 20% improvement obtained in the jitter measurement.

Figure 13A:
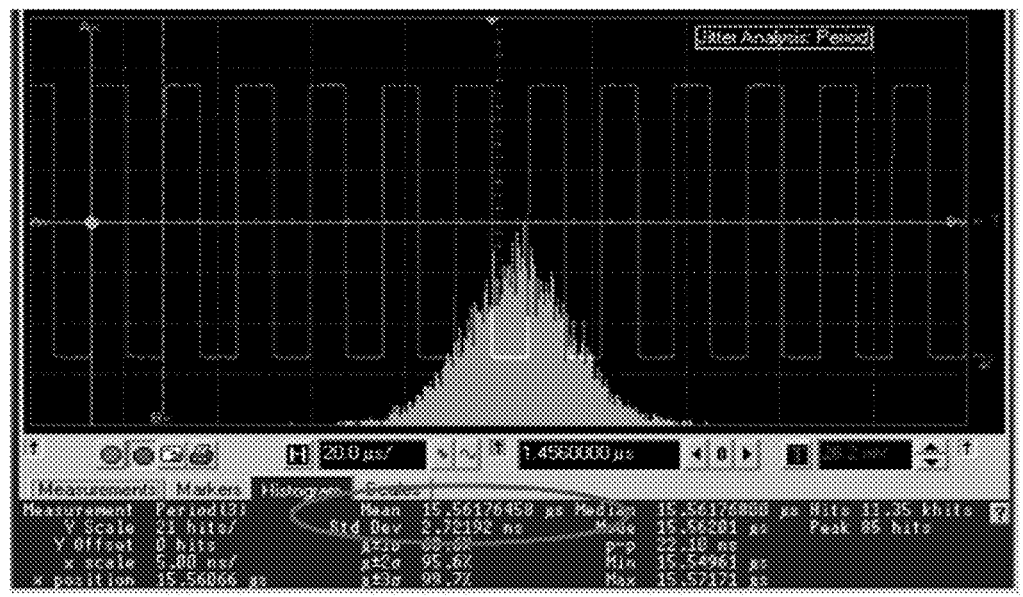
FIGS. 13A and 13B illustrate the measured jitter performances of the relaxation oscillator of FIG. 7 and the conventional relaxation oscillator, respectively.
Figure 13B:
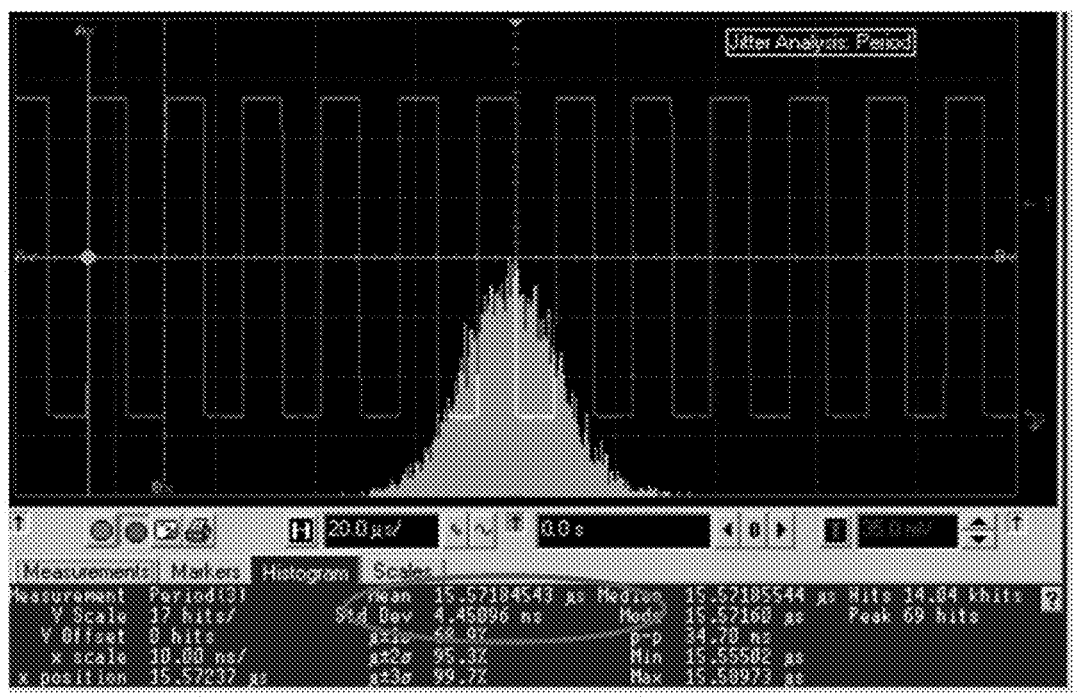
Figure 14:
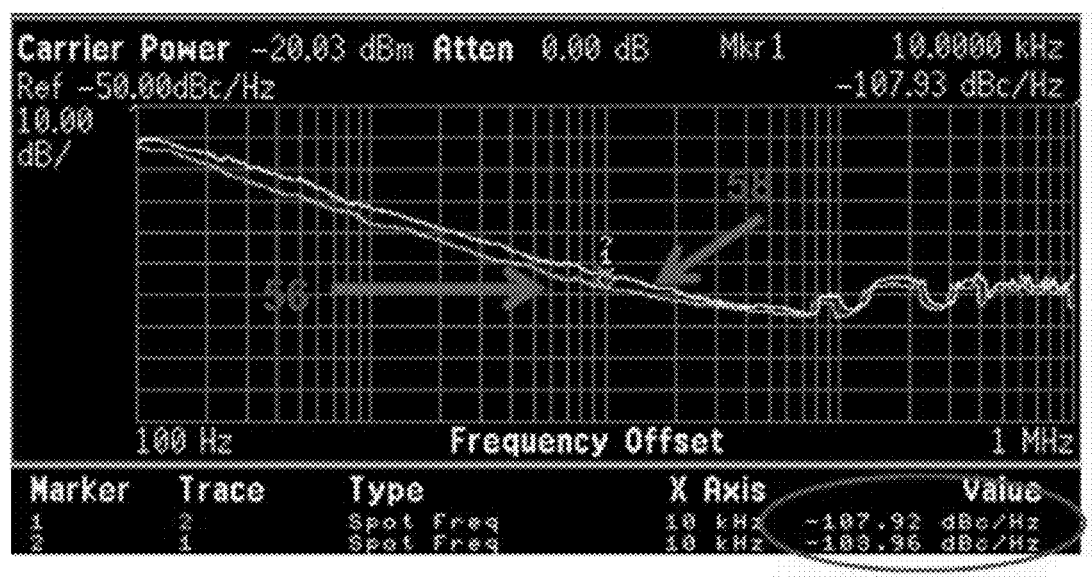
FIG. 14 shows a comparison between the phase noise measurement results of the relaxation oscillator of FIG. 7 and the conventional relaxation oscillator.

The measured jitter performance 56 of the relaxation oscillator 16*b* with the dynamic capacitor circuit 50 and the measured jitter performance 58 of the conventional relaxation oscillator are presented in FIGS. 13A and 13B respectively. When both oscillators operate at 64 kHz, the measured periodic RMS jitter of the relaxation oscillator 16*b* is 175 ppm, which is 40% better than 285.7 ppm jitter of the conventional relaxation oscillator. FIG. 14 illustrates the phase noise measurement result from the relaxation oscillator 16*b* and the conventional relaxation oscillator. The measured phase noise of the relaxation oscillator 16*b* with dynamic capacitor and the convention relaxation oscillator is −107.9 and −103.9 dBc/Hz respectively at 10-kHz offset when the oscillation frequency is 64 kHz. This result agrees with the 40% improvement obtained in the jitter measurement.

Figure 15A:
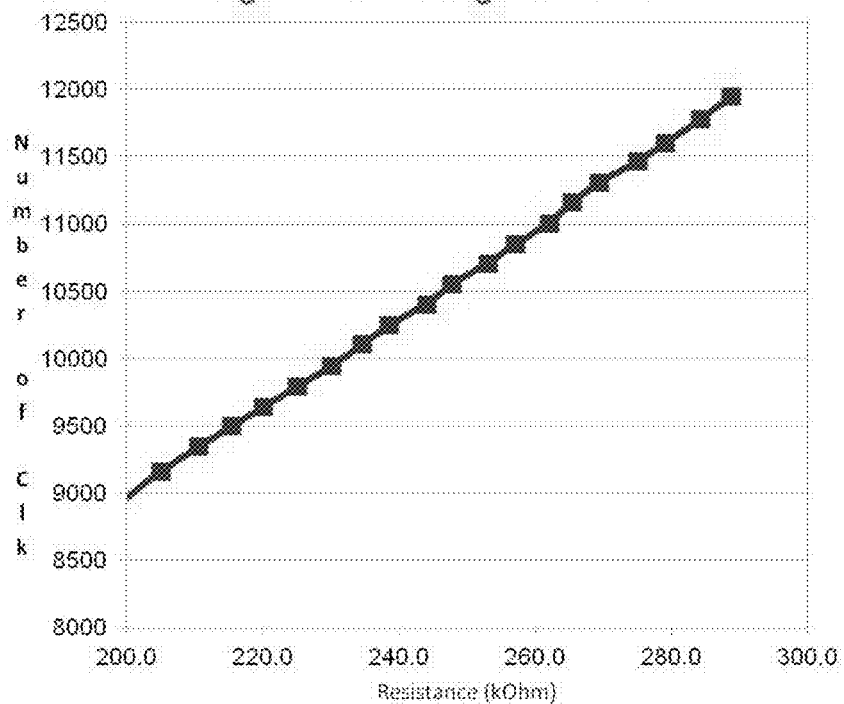
FIGS. 15A and 15B illustrate the measured dynamic range performance of the sensor interface with the output frequency counting scheme according to the first embodiment and the conventional output frequency counting scheme, respectively.
Figure 15B:
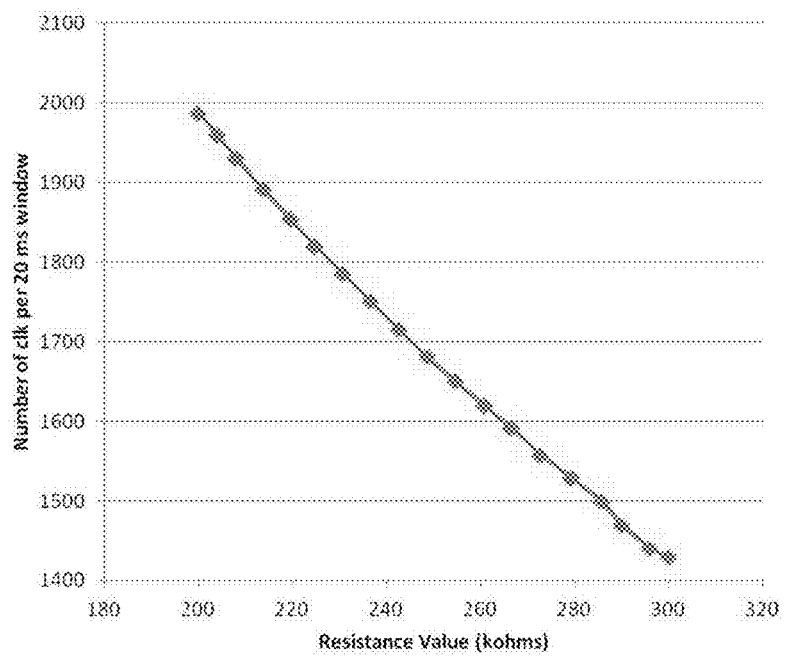

The measured dynamic range performance of the relaxation oscillator based sensor interface with the modified output frequency counting scheme as described in the first embodiment and the conventional output frequency counting scheme are presented in FIGS. 15A and 15B. The sensor interface with the conventional and modified counting scheme achieves 8.1 and 10.55 bits resolution respectively. This shows that the modified counting scheme has improved resolution. However, the improvement is limited due to the jitter performance of the relaxation oscillator. Accordingly, the resolution can be further improved when combined with the jitter improvement technique(s) described hereinbefore in the second embodiment.

Accordingly, a low power high resolution relaxation oscillator based sensor interface circuit is provided according to embodiments of the present invention. In particular, a modified output frequency counting scheme has been described hereinbefore along with dynamic discharging jitter improvement techniques for improving the resolution of the relaxation oscillator based sensor interface circuit. In an example, the resolution of the sensor interface circuit can be improved to 10.55-15.5 bits, while consuming only 12.5 uW with a die size of only 0.03 mm$^2$.

It will be appreciated by those skilled in the art that modifications and variations to the present invention described herein will be apparent departing from the scope thereof. For example, although the Figures illustrate that the sensors 14 are resistive sensors, it will be apparent to a person skilled in the art resistive sensors can be replaced with capacitive sensors. The variations and modifications as would be apparent to persons skilled in the art are deemed to fall within the broad scope and ambit of the present invention as herein set forth.

What is claimed is:

1. A sensor interface circuit for resolving sensor signals from a plurality of sensors into a digital sensor signal, the sensor interface circuit comprising:
    a relaxation oscillator for receiving and pre-processing the sensor signals to generate an analog sensor signal, the relaxation oscillator comprising one or more dynamic circuits; and
    a monitoring module for receiving the analog sensor signal and generating the digital sensor signal in response thereto, the monitoring module comprising:
        a fixed frequency generation device for generating a clock signal having a fixed frequency of clock pulses; and
        a variable window frequency counting device for determining a number of clock pulses within a variable counting window.

2. The sensor interface circuit in accordance with claim 1 wherein the variable window frequency counting device varies the variable counting window between a predetermined minimum oscillator frequency and a predetermined maximum oscillator frequency, the predetermined minimum oscillator frequency and the predetermined maximum oscillator frequency determined in response to operational parameters of the relaxation oscillator.

3. The sensor interface circuit in accordance with claim 1 wherein the fixed frequency generation device has a fixed frequency determined in response to operational parameters of the relaxation oscillator.

4. The sensor interface circuit in accordance with claim 1 wherein the monitoring module further comprises front end circuitry coupled between the relaxation oscillator and the variable window frequency counting device for pre-processing the analog signal from the relaxation oscillator for frequency counting by the variable window frequency counting device.

5. The sensor interface circuit in accordance with claim 1 wherein the relaxation oscillator further comprises one or more comparators having a comparator reference voltage, and wherein the one or more dynamic circuits includes a dynamic capacitor circuit coupled to the comparators, the dynamic capacitor circuit being configured to reduce its discharge capacitance in response to a determination that its capacitor voltage approximates the comparator reference voltage of the one or more comparators.

6. The sensor interface circuit in accordance with claim 5 wherein the dynamic capacitor circuit comprises one or more MOS varactors respectively coupled to the one or more comparators.

7. The sensor interface circuit in accordance with claim 1 wherein the relaxation oscillator further comprises one or more capacitors, and wherein the one or more dynamic circuits includes a dynamic current discharge circuit coupled to the one or more capacitors, the dynamic current discharge circuit being configured to increase a discharge current for the one or more capacitors in response to a determination that a voltage of the one or more capacitors approximates a comparator reference voltage.

8. The sensor interface circuit in accordance with claim 7 wherein the relaxation oscillator further comprises one or more comparators having the comparator reference voltage, and wherein the one or more dynamic circuits further includes a dynamic capacitor circuit comprising the one or more capacitors and coupled to the comparators, and wherein the dynamic current discharge circuit is configured to increase the discharge current and the dynamic capacitor circuit is configured to reduce its discharge capacitance in response to a determination that its capacitor voltage approximates the comparator reference voltage.

9. A sensor system front-end comprising:
    a plurality of sensors; and
    a sensor interface for resolving sensor signals from the plurality of sensors into a digital sensor signal, the sensor interface comprising:

a relaxation oscillator for receiving and pre-processing the sensor signals to generate an analog sensor signal, the relaxation oscillator comprising one or more dynamic circuits; and a monitoring module for receiving the analog sensor signal and generating the digital sensor signal in response thereto, wherein the monitoring module comprises:

a fixed frequency generation device for generating a clock signal having a fixed frequency of clock pulses; and a variable window frequency counting device for determining a number of clock pulses within a variable counting window.

10. The sensor system in accordance with claim 9 wherein the plurality of sensors comprise a plurality of resistive sensors.

11. The sensor system in accordance with claim 9 wherein the plurality of sensors comprise a plurality of capacitive sensors.

12. The sensor system in accordance with claim 9 wherein the variable window frequency counting device varies the variable counting window between a predetermined minimum oscillator frequency and a predetermined maximum oscillator frequency, the predetermined minimum oscillator frequency and the predetermined maximum oscillator frequency determined in response to operational parameters of the relaxation oscillator.

13. The sensor system in accordance with claim 9 wherein the fixed frequency generation device has a fixed frequency determined in response to operational parameters of the relaxation oscillator, and wherein the monitoring module further comprises front end circuitry coupled between the relaxation oscillator and the variable window frequency counting device for pre-processing the analog signal from the relaxation oscillator for frequency counting by the variable window frequency counting device.

14. The sensor system in accordance with claim 9 wherein the relaxation oscillator further comprises one or more comparators having a comparator reference voltage, and wherein the one or more dynamic circuits includes a dynamic capacitor circuit coupled to the comparators, the dynamic capacitor circuit being configured to reduce its discharge capacitance in response to a determination that its capacitor voltage approximates the comparator reference voltage of the one or more comparators.

15. The sensor system in accordance with claim 14 wherein the dynamic capacitor circuit comprises one or more MOS varactors respectively coupled to the one or more comparators.

16. The sensor system in accordance with claim 9 wherein the relaxation oscillator further comprises one or more capacitors, and wherein the one or more dynamic circuits includes a dynamic current discharge circuit coupled to the one or more capacitors, the dynamic current discharge circuit being configured to increase a discharge current for the one or more capacitors in response to a determination that a voltage of the one or more capacitors approximates a comparator reference voltage.

17. The sensor system in accordance with claim 16 wherein the relaxation oscillator further comprises one or more comparators having the comparator reference voltage, and wherein the one or more dynamic circuits further includes a dynamic capacitor circuit comprising the one or more capacitors and coupled to the comparators, and wherein the dynamic current discharge circuit is configured to increase the discharge current and the dynamic capacitor circuit is configured to reduce its discharge capacitance in response to a determination that its capacitor voltage approximates the comparator reference voltage.

18. A relaxation oscillator comprising:

comparators, each having a comparator reference voltage input, a signal input and an output, wherein the comparator reference voltage input of each of the comparators are connected to a comparator reference voltage source;

variable capacitors, wherein the number of the variable capacitors is equal to the number of the comparators, and wherein each of the variable capacitors is connected between a ground voltage potential and the signal input of a corresponding one of the comparators and each of the variable capacitors is controlled to reduce its discharging capacitance only when its capacitor voltage approximates a voltage of the comparator reference voltage source;

discharge circuits respectively coupled to the variable capacitors, each of the discharge circuits coupled to the respective variable capacitor is coupled to the ground voltage potential and an oscillator output, the discharge circuits are configured to increase a discharge current for the variable capacitors only when a voltage of the variable capacitors approximates the voltage of the comparator reference voltage source;

an oscillator input section for receiving a sensor input from a plurality of sensors and providing the sensor input to each of the signal inputs of the comparators; and a frequency generation circuit coupled to the output of the comparators and to the oscillator input section for generating an analog signal from the sensor input for provision to an oscillator output of the frequency generation circuit by controlling provision of the sensor input to the signal inputs of the comparators.

\* \* \* \* \*